(12) United States Patent
Choi et al.

(10) Patent No.: US 8,178,369 B2
(45) Date of Patent: May 15, 2012

(54) NANOSCALE MULTI-JUNCTION QUANTUM DOT DEVICE AND FABRICATION METHOD THEREOF

(75) Inventors: Jung Bum Choi, Cheongju-si (KR); Jong Jin Lee, Cheongju (KR); Seung-Jun Shin, Pyeongchang-gun (KR); Rae-Sik Chung, Andong (KR)

(73) Assignee: Nanochips, Inc., Heungdeok-gu, Cheongju-si (KR)

( * ) Notice: Subject to any disclaimer, the term of this patent is extended or adjusted under 35 U.S.C. 154(b) by 491 days.

(21) Appl. No.: 12/444,956

(22) PCT Filed: Oct. 8, 2007

(86) PCT No.: PCT/KR2007/004891
§ 371 (c)(1),
(2), (4) Date: Apr. 9, 2009

(87) PCT Pub. No.: WO2008/044843
PCT Pub. Date: Apr. 17, 2008

(65) Prior Publication Data
US 2010/0006821 A1    Jan. 14, 2010

(30) Foreign Application Priority Data
Oct. 9, 2006   (KR) .................. 10-2006-0097768

(51) Int. Cl.
H01L 21/00 (2006.01)
(52) U.S. Cl. ........................... 438/22; 438/48; 257/20
(58) Field of Classification Search .................. 257/20; 438/22, 48
See application file for complete search history.

(56) References Cited

U.S. PATENT DOCUMENTS
5,972,744 A   10/1999   Morimoto et al.
2005/0142753 A1 *  6/2005   Koh .......................... 438/257

FOREIGN PATENT DOCUMENTS
JP   2005197701 A   7/2009
KR   2001066049 A   7/2001

* cited by examiner

*Primary Examiner* — Anthony Ho
(74) *Attorney, Agent, or Firm* — Thomas R. FitzGerald, Esq.; Hiscock & Barclay, LLP (57) ABSTRACT

The present invention relates to a method of fabricating a nanoscale multi-junction quantum dot device wherein it can minimize constraints depending on the number or shape of patterns and a line width, and in particular, overcome shortcomings depending on the proximity effect occurring between patterns while employing the advantages of electron beam lithography to the utmost by forming a new conductive layer between the patterns and utilizing it as a new pattern.

16 Claims, 9 Drawing Sheets

NANOSCALE MULTI-JUNCTION QUANTUM DOT DEVICE AND FABRICATION METHOD THEREOF

TECHNICAL FIELD

The present invention relates a nanoscale multi-junction quantum dot device and a fabrication method thereof, and more particularly, to a nanoscale multi-junction quantum dot device and a fabrication method thereof, wherein a new conductive layer is formed in a space between patterns and is then utilized as a new pattern, thus overcoming the existing lithography limits.

BACKGROUND ART

In general, the most widely used method of methods of forming a pattern on a silicon wafer is photolithography using ultraviolet rays and a photoresist. A method of reproducing the most nonoscale pattern is electron beam lithography. In addition, there are methods employing FIB, nanoimprint, sidewall, and so on.

If a single line is formed using only the existing pattern formation method, it generally has several tens of nanometers. A reproducible line width of several nanometers can be obtained using only several methods.

Further, in the case of a multi-line, a space must be placed between lines in order to separate the respective lines. In this case, not only the size of an overall pattern can be increased due to the space, but also the line width of an individual line and the space between the lines are more limited due to the proximity effect, etc. when compared with the single line.

In the event that a pattern having a line width of several tens of nanometers and a relatively simple structure is formed using the existing pattern formation method as described above, there are no particular problems. However, in the case where a multi-pattern having a complicated shape and structure and requiring a very small size due to the level of integration of devices is required, it is practically impossible to obtain a desired producible pattern.

Of the conventional pattern formation methods, electron beam lithography that has been most widely used in nonoscale patterns has the following problems.

1) Electron beam lithography has the greatest efficiency in the number or shape of patterns and a line width, but has the proximity effect occurring neighboring patterns as a width between patterns is narrowed.

2) There is a limit to reduce a width between patterns because of the proximity effect.

DISCLOSURE OF INVENTION

Technical Problem

An object of the present invention is to provide a nanoscale multi-junction quantum dot device and a fabrication method thereof, wherein it can minimize constraints depending on the number or shape of patterns and a line width, and in particular, overcome shortcomings depending on the proximity effect occurring between patterns while employing the advantages of electron beam lithography to the utmost by forming a new conductive layer between the patterns and utilizing it as a new pattern.

Technical Solution

To achieve the above object, the present invention includes:

(a) patterning a source and a drain, connected through a channel, on top silicon of a wafer, and etching the pattern;

(b) implanting and doping ions into the formed pattern;

(c) forming a first dielectric film on the top silicon;

(d) depositing a first conductive layer to surround the first dielectric film;

(e) coating a resist on the first conductive layer;

(f) forming at least three resist lines by developing the resist;

(g) etching the first conductive layer to the first dielectric film except for the respective resist lines, thus forming nonoscale patterns respectively having the same line width as that of the resist line;

(h) forming a second dielectric film for insulation on each nonoscale pattern;

(i) depositing a second conductive layer between the nonoscale patterns on which the second dielectric films are formed;

(j) polishing the top silicon;

(k) forming a dielectric film for electrical insulation on the top silicon;

(l) depositing a third conductive layer on the dielectric film; and (m) patterning and etching at least two sensing elements, which correspond to at least two quantum dots, which are formed in the channel in the polishing step (j), and are adjacent to each other.

Further, the patterning and etch step (a) employs a Silicon On Insulator (SOI) wafer as the wafer and is performed using a CMOS process and electron beam lithography.

Further, the channel has a line width of several to several tens of nanometers.

Further, in the doping step (b), the source and the drain are doped with an N type impurity, and the channel is doped with a P type impurity.

Further, the first dielectric film formation step (c) is performed using a thermal oxidization process.

Further, the deposit step (d) includes thickly depositing the first conductive layer than the top silicon.

Further, the coating step (e) includes coating an electro resist.

Further, the resist line formation step (f) is performed using electron beam lithography so that the resist lines become vertical to the channel.

Further, the nonoscale pattern formation step (g) is performed by employing anisotropic etching.

Further, in the polishing step (j), two pairs of tunneling barrier gates, which face each other around the channel, are formed, a pair of coupling gates is formed between the two pairs of tunneling barrier gates, and every pair of control gates is formed between the tunneling barrier gates and the coupling gates, respectively.

Further, quantum dots are formed at positions where each pair of control gates faces each other in the channel.

Further, in the polishing step (j), a gate for forming quantum dots of the top silicon and a gate for controlling a state of the quantum dots are formed on both sides of the channel in such a way as to operate independently of each other, or a gate is selectively formed in such a way as to surround left, right and top surfaces of the channel, by controlling a polished depth.

Further, the pattern etch step (m) includes performing patterning using lithography and then etching.

Further, the pattern etch step (m) includes performing patterning and etching a single electron transistor, a radio-frequency single electron transistor (RF-SET), and a Quantum Point Contact (QPC) as sensing elements.

Meanwhile, there is provided a nanoscale multi-junction quantum dot device fabricated according to any one of the fabrication methods.

Advantageous Effects

The present invention has the following advantages.

1) Since a gap between patterns is formed as another pattern, the same result as substantially improved lithography performance can be obtained.

2) As a polishing process is applied, not only patterns are cut off, but also a completed structure has a plane. Thus, a multi-structure can be obtained by depositing additional conductive layers after dielectric films are formed.

3) If a material capable of implementing a conductive channel, such as another polysilicon, is laminated and patterned by employing characteristics of a wafer to which the polishing process is applied, a sensor for sensing a charge distribution state of electrons within quantum dots of a lower layer that is already fabricated can also be fabricated.

4) Quantum dots having a size much smaller than that of quantum dots, which could be fabricated using the existing top-down method, can be formed and controlled through processes, such as nonoscale pattering and polishing employing electron beam lithography.

DESCRIPTION OF REFERENCE NUMERALS OF PRINCIPAL ELEMENTS IN THE DRAWINGS

BG: metal layer
BOX: buried oxide layer
CG: coupling gate
CG1, CG2: control gate
D1: drain
BG1, BG2: tunneling barrier gate
RE: resist
REL: resist line
DL1, DL2: first and second dielectric films
PAT: nonoscale pattern
CL1, CL2, CL3: first, second, third conductive layers
QD1, QD2: quantum dot
S1: source
SM1, SM2: sensing element
SUB: substrate
TS: top silicon

MODE FOR INVENTION

A method of fabricating a nanoscale multi-junction quantum dot device according to the present invention will now be described with reference to the accompanying drawings.

Top silicon TS of a wafer first experiences a pattern formation and etch process (a). In a preferred embodiment of the present invention, the wafer has an insulating layer formed between base layers, and may use any kind of a wafer which can increase processing or efficiency of a high-purity silicon layer formed on the insulating layer. However, a Silicon On Insulator (SOI) wafer can be preferably used.

First, in pattern formation, a pattern is formed so that a source S1 and a drain D1 formed on the top silicon TS at a predetermined interval are connected through a channel CH. In the pattern and etch process, a CMOS process and electron beam lithography are employed so that the channel CH having a line width of several to several tens of nanometers can be formed. The source S1 and the drain D1 respectively refer to the source and drain of a single electron transistor in which dual quantum dots will be formed.

A doping process (b) of implanting ions into the pattern is then performed. In the doping process (b), the source S1 and the drain D1 are doped with an N type impurity and the channel CH is doped with a P type impurity.

Figure 1:
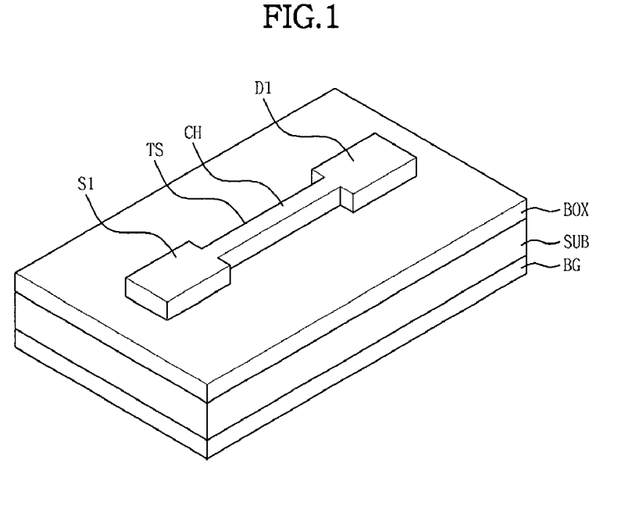
FIG. 1 is a perspective view illustrating a state where a pattern, including a source, a drain and a channel, is formed according to the present invention.

FIG. 1 is a perspective view illustrating a state where the pattern, including the source S1, the drain D1 and the channel CH, is formed according to the present invention. In this state, doping is performed through the process of implanting ions. Unexplained reference numerals SUB indicates a substrate, BG indicates a metal layer deposited on a bottom surface of the substrate, BOX indicates a buried oxide layer.

Figure 2:
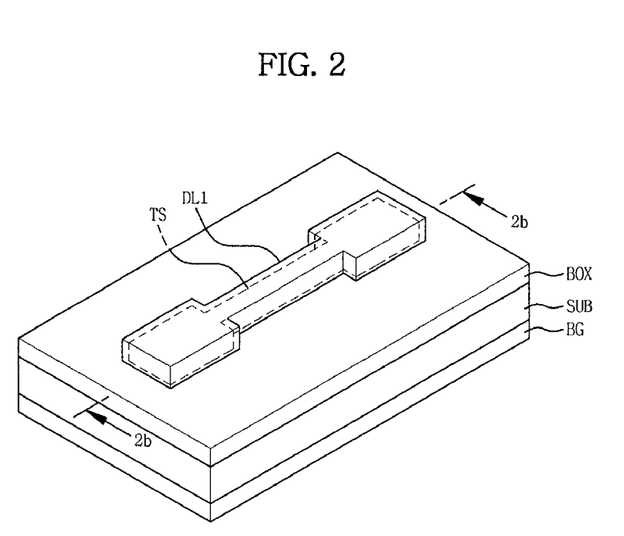
FIG. 2 is a perspective view illustrating that a first dielectric film is formed according to a fabrication method of the present invention.
Figure 3:
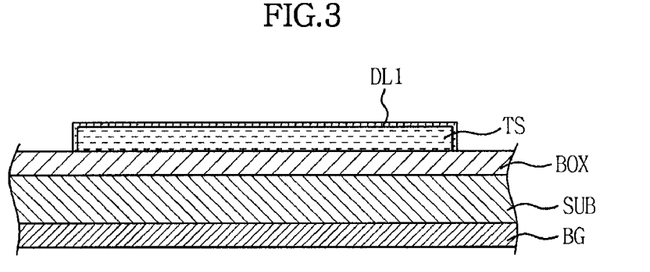
FIG. 3 is a sectional view of line 2b-2b in FIG. 2.

If the doping process (b) is finished, a process (c) of forming a first dielectric film DL1 on a surface of the top silicon TS is performed as shown in FIG. 2. The first dielectric film DL1 formed in this process is a kind of an insulating layer, and is formed through a thermal oxidization process. The first dielectric film DL1 functions to electrically insulate the top silicon TS from a pattern that will be formed later on, as shown in FIG. 3.

Figure 4:
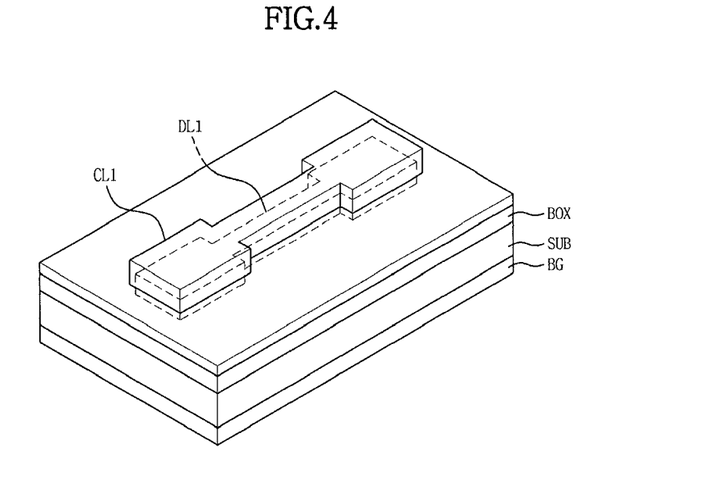
FIG. 4 is a perspective view illustrating a state where a first conductive layer is deposited according to the fabrication method of the present invention.

Step (d) of forming a first conductive layer CL1 on the top silicon TS is then performed. The first conductive layer CL1 has a size to surround the entire pattern covered with the first dielectric film DL1, as shown in FIG. 4. In particular, the first conductive layer CL1 is preferably formed higher than the first dielectric film DL1. A portion where the pattern exists and a portion where the pattern does not exist on the buried oxide layer BOX, of the first conductive layer CL1, are preferably stepped.

Figure 5:
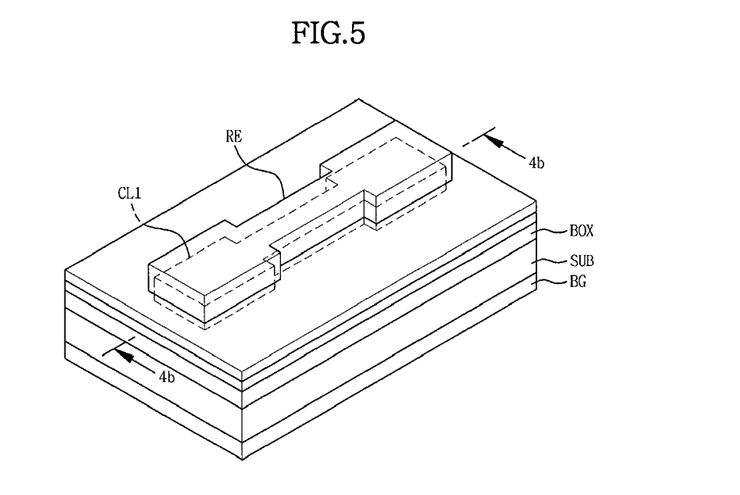
FIG. 5 is a perspective view illustrating a state where a resist is coated on the first conductive layer according to the fabrication method of the present invention.
Figure 6:
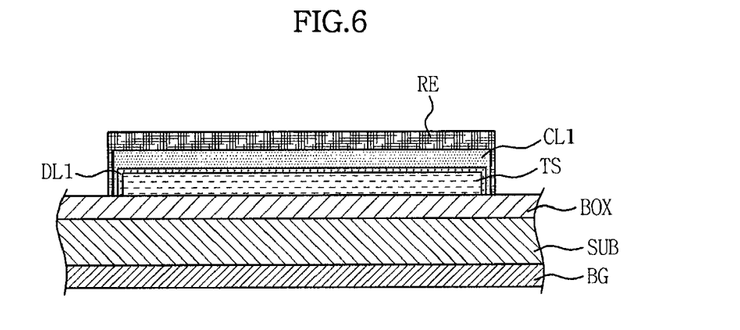
FIG. 6 is a sectional view of line 4b-4b in FIG. 5.

If the process (d) of forming the first conductive layer CL1 is finished, a process (e) of coating a resist RE is carried out. FIG. 5 is a perspective view illustrating a state where the resist is coated according to the present invention. FIG. 6 is a sectional view of line 4b-4b in FIG. 5 for illustrating the resist RE formed on the first conductive layer CL1.

Figure 7:
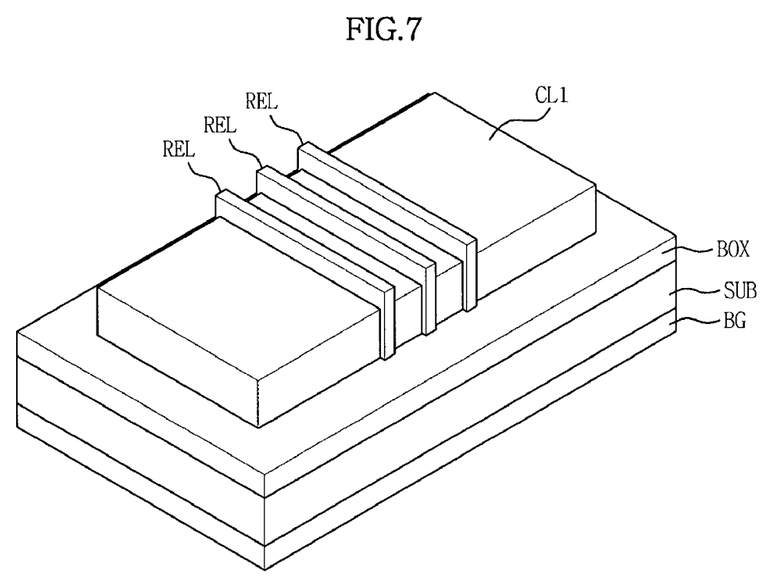
FIG. 7 is a perspective view illustrating a state where resist lines are formed according to the fabrication method of the present invention.

FIG. 7 illustrates a process (f) of forming resist lines REL by developing the resist RE. In a preferred embodiment of the present invention, it has been shown that three resist lines REL are formed, but three or more resist lines REL may be formed in consideration of the junction number of quantum dots.

Thereafter, a process (g) of forming a nonoscale pattern is performed. The nonoscale pattern PAT is formed by etching only the remaining first conductive layer CL1 other than each resist line REL.

Figure 8:
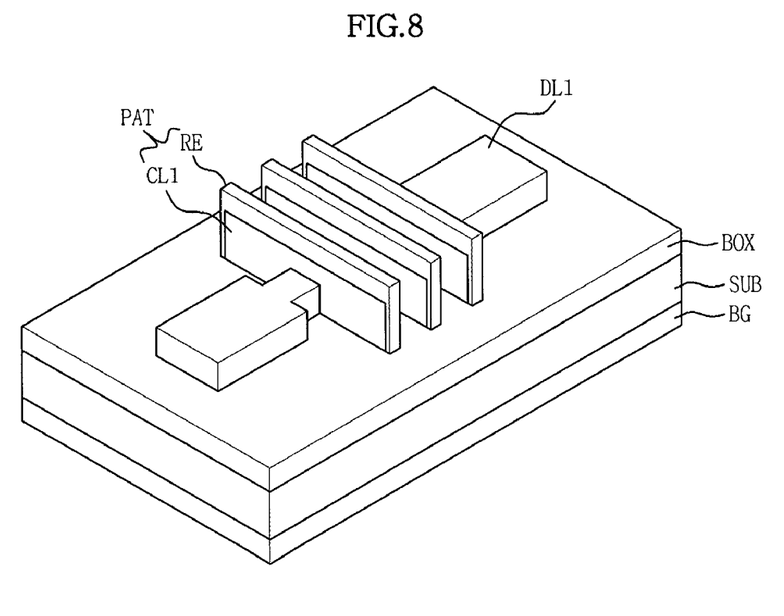
FIG. 8 is a perspective view illustrating a state where nonoscale patterns are formed according to the fabrication method of the present invention.

Thus, each nonoscale pattern PAT has the same width as that of the resist line REL, as shown in FIG. 8.

Figure 9:
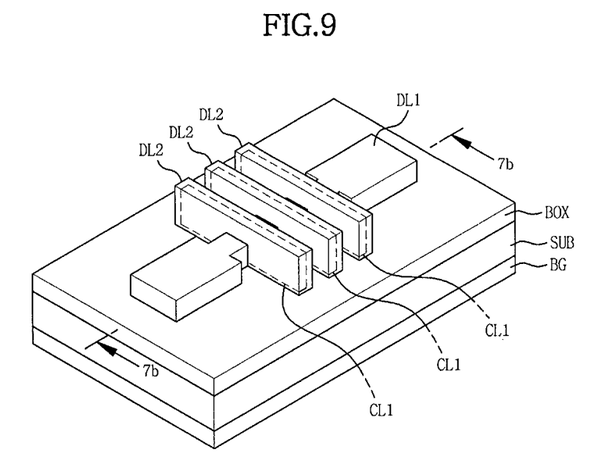
FIG. 9 is a perspective view illustrating a state where second dielectric films are formed on the nonoscale patterns according to the fabrication method of the present invention.
Figure 10:
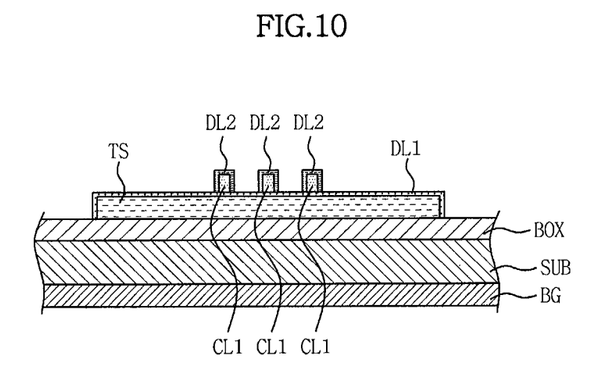
FIG. 10 is a sectional view of line 7b-7b in FIG. 9.

After the nonoscale patterns are formed, a process (h) of forming second dielectric films is performed. The second dielectric film DL2 is formed through a process of forming a dielectric film on the nonoscale pattern PAT. Preferably, the dielectric film is formed on the entire surface of the first conductive layer CL1 etched through a thermal oxidization process, so that it is electrically insulated from a second conductive layer CL2 that will be formed in a next process. FIGS. 9 and 10 are views illustrating a state where the second dielectric film DL2 is formed.

Figure 11:
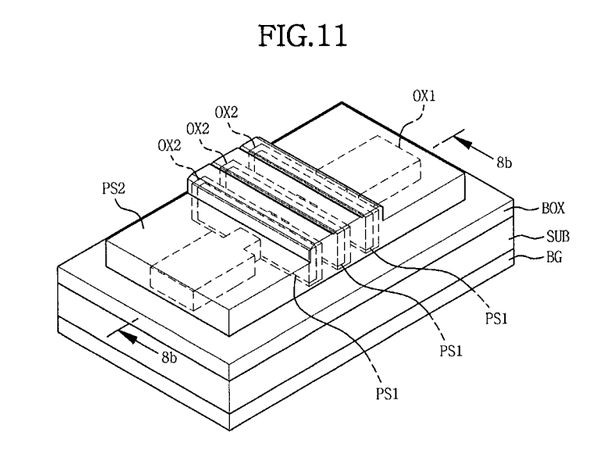
FIG. 11 is a perspective view illustrating a state where a second conductive layer is deposited according to the fabrication method of the present invention.
Figure 12:
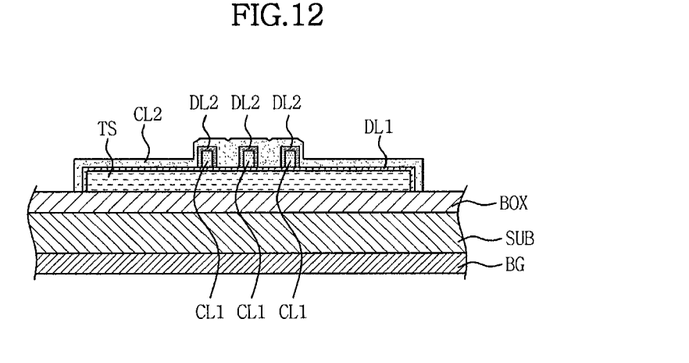
FIG. 12 is a sectional view of line 8b-8b in FIG. 11.

After the second dielectric film DL2 is formed, a process (i) of depositing the second conductive layer CL2 is performed. In this process (i), the second conductive layer CL2 is preferably deposited so that the portions between the nonoscale patterns PAT on which not only the first dielectric film DL1, but also in particular, the second dielectric film DL2 is formed are fully filled with the second conductive layer CL2, as shown in FIGS. 11 and 12.

Figure 13:
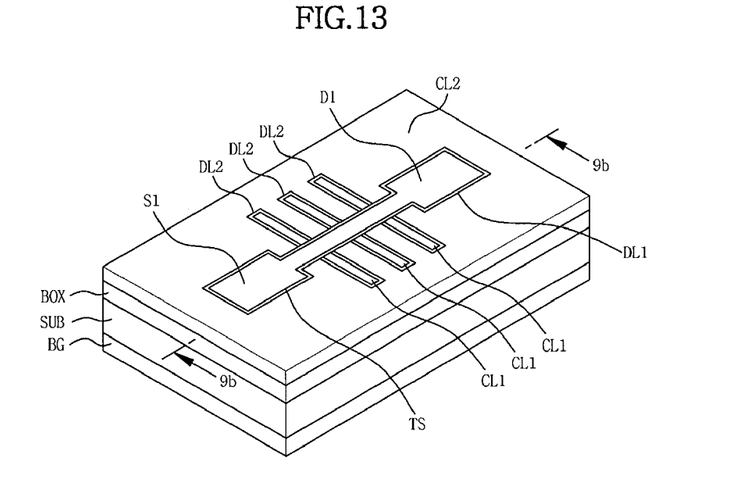
FIG. 13 is a perspective view illustrating a wafer that has experienced a polishing step according to the fabrication method of the present invention.
Figure 14:
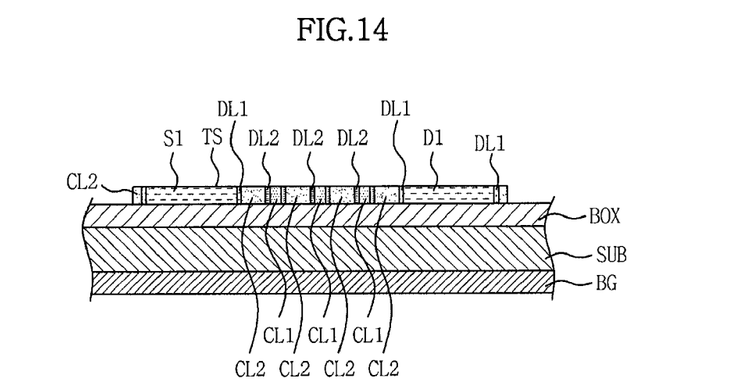
FIG. 14 is a sectional view of line 9b-9b in FIG. 13.

Thereafter, a polishing process (j) of polishing the second conductive layer CL2 is carried out. The degree of polishing is preferably performed until the top silicon TS is exposed, as shown in FIGS. 13 and 14.

Thus, the top silicon TS has a shape surrounded by the first dielectric film DL1, and the first conductive layers CL1 forming the nonoscale patterns PAT are surrounded by the second dielectric film DL2. Further, the remaining portions of the top silicon TS have a shape filled with the second conductive layer CL2, and the first dielectric film DL1 and the second dielectric film DL2 are interconnected.

Figure 15:
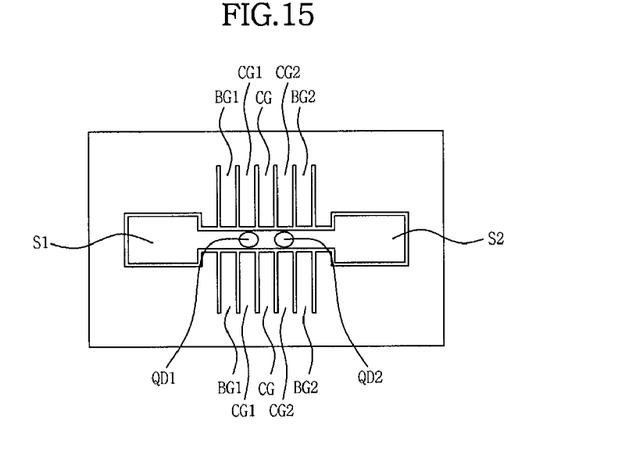
FIG. 15 is a plan view for illustrating positions where dual quantum dots are formed after the dielectric film formation step according to the fabrication method of the present invention.

Accordingly, ten gates are formed on both sides of the channel CH by the three first conductive layers CL1 in which the second conductive layers CL2 are respectively insulated by the dielectric films, as shown in FIG. 15. The ten gates will be described in more detail in a next process.

As a subsequent process, a dielectric film formation process (k) is then performed. The dielectric films formed in this process are for the purpose of electrical insulation, and are formed through deposition. Therefore, a total of ten independent gates can be obtained through the three nonoscale patterns formed using electron beam lithography.

The ten gates are now described with reference to FIG. 15. Two pairs of tunneling barrier gates BG1, BG2, which are vertically opposite to the channel CH on both sides at places adjacent to the source S1 and the drain D1, and respectively form potential barriers, a pair of coupling gates CG formed between the tunneling barrier gates BG1 and the tunneling barrier gates BG2 and configured to control the coupling of the pair of quantum dots QD1, QD2, and two pairs of control gates CG1, CG2 formed between the tunneling barrier gates BG1, BG2 and the coupling gates, respectively, and configured to control the energy level of a corresponding quantum dot are obtained.

The pair of quantum dots QD1, QD2 is formed within the channel CH where the pairs of the control gates CG1, CG2 are opposite to each other.

Figure 16:
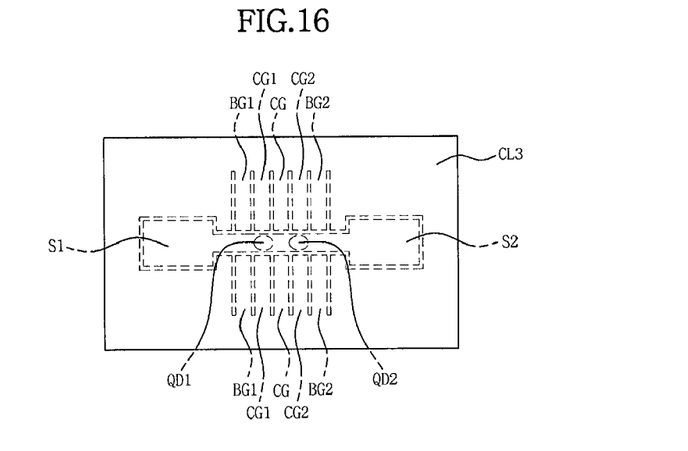
FIG. 16 is a plan view illustrating a state where a third conductive layer is formed according to the fabrication method of the present invention.

Thereafter, a process (l) of forming a sensing element for sensing an electron state of the quantum dot is carried out. To this end, a third conductive layer CL3 is deposited on the dielectric films deposited on the top silicon TS. FIG. 16 illustrates a state where the third conductive layer CL3 is formed on the dielectric films.

Figure 17:
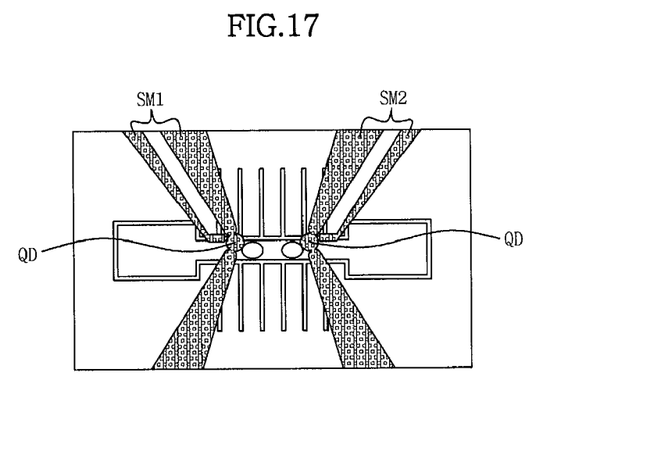
FIG. 17 is a plan view illustrating an example in which two sensing elements are formed according to the fabrication method of the present invention.

As a last process, a process (m) of patterning the sensing elements SM1, SM2 on the third conductive layer CL3 and performing etching is performed. At this time, the sensing elements SM1, SM2 are preferably formed through electron beam lithography so that they are adjacent to the quantum dots QD1, QD2. In a preferred embodiment of the present invention, there is shown an example in which two single electron transistors are formed, as shown in FIG. 17.

Furthermore, in a preferred embodiment of the present invention, though not shown in the drawings, an example where the single electron transistor for sensing electrons is formed has been described. However, a method of pattering and using a Quantum Point Contact (QPC) or a radio-frequency single electron transistor RF-SET is also possible.

Accordingly, the state of electrons existing therein can be sensed from the two quantum dots QD1, QD2 using the sensing elements SM1, SM2.

Hereinafter, an operating state of the nanoscale multi-junction quantum dot device according to the present invention is described in short below.

First, in order to generate the two quantum dots QD1, QD2, an adequate voltage is applied to the metal layer BG, thus forming a two-dimensional electron gas layer in the channel CH. An adequate voltage is then applied to the two pairs of tunneling barrier gates BG1, BG2 and the pair of coupling gates CG.

Thus, the two quantum dots QD1, QD2 are formed within the channel CH in which the two pairs of control gates CG1, CG2 face each other, as shown in FIG. 15.

The thus formed quantum dots QD1, QD2 can be used to detect its state using the sensing elements SM1, SM2 adjacent to the respective quantum dots, as shown in FIG. 17.

Meanwhile, the nanoscale multi-junction quantum dot device according to the present invention can be fabricated using the above method.

A method of fabricating the device through deposition according to the present invention is described below.

In the above device fabrication method, the same fabrication processes, that is, the process (a) to the process (g) will not be described.

After nanoscale patterns are formed, a process (h) of forming a second dielectric film is performed. The second dielectric film DL2 is formed through a process of forming a dielectric film on the nanoscale patterns PAT, preferably, through a deposition process.

Figure 18:
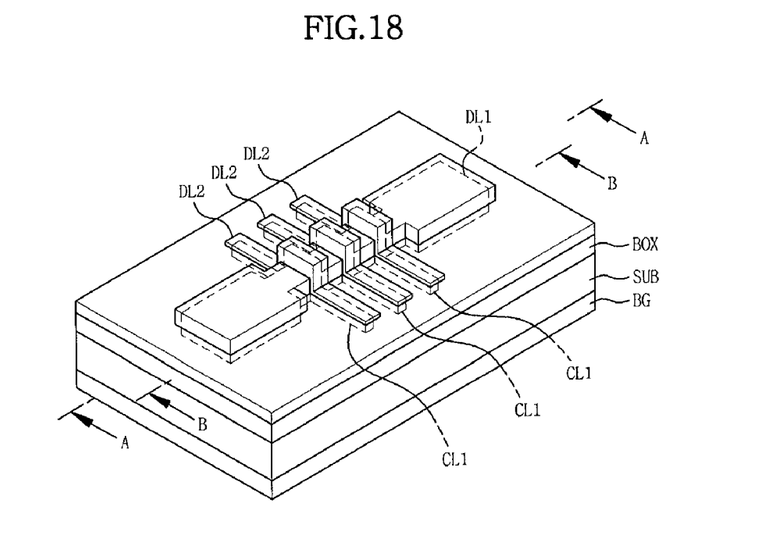
FIG. 18 is a perspective view illustrating an example in which the second dielectric films are formed by deposition in the fabrication method of the present invention.
Figure 19:
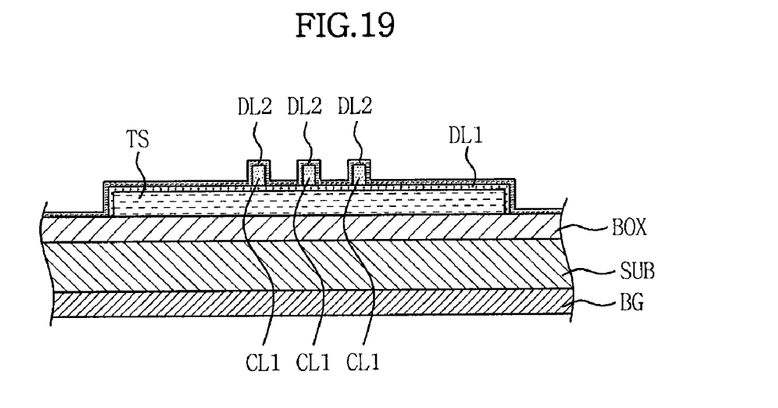
FIG. 19 is a sectional view of line A-A in FIG. 18.
Figure 20:
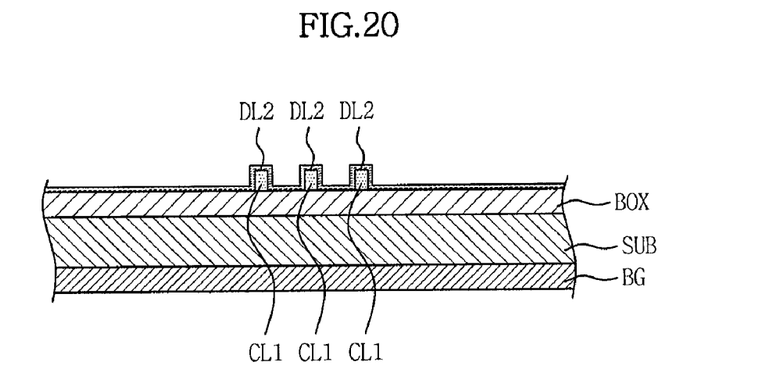
FIG. 20 is a sectional view of line B-B in FIG. 18.

Thus, the second dielectric film DL2 is formed over the entire wafer, including not only an external surface of the first conductive layers CL1, but also the buried oxide layer BOX, to a predetermined thickness. FIG. 18 is a perspective view illustrating that the second dielectric film DL2 is formed by deposition. FIG. 19 is a sectional view of line A-A in FIG. 18 where a channel exists. FIG. 20 is a sectional view of line B-B for illustrating steps at portions where the channel does not exist.

A process (i) of depositing a second conductive layer CL2 is then performed. In a preferred embodiment of the present invention, the second conductive layer CL2 is performed over the entire wafer through a deposition process so that the portions between the nanoscale patterns PAT are fully filled with the second conductive layer CL2, as shown in FIG. 21.

Figure 21:
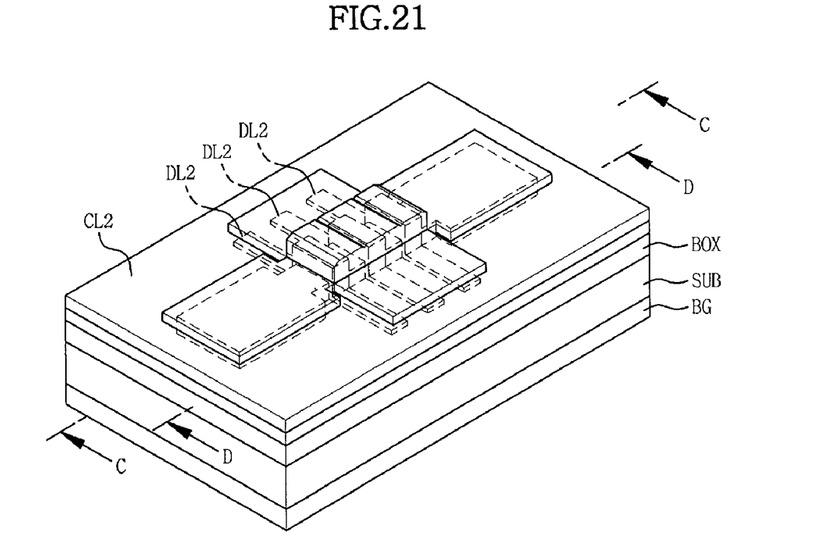
FIG. 21 is a perspective view illustrating an example in which the second conductive layer CL2 is formed by deposition in the fabrication method of the present invention.
Figure 22:
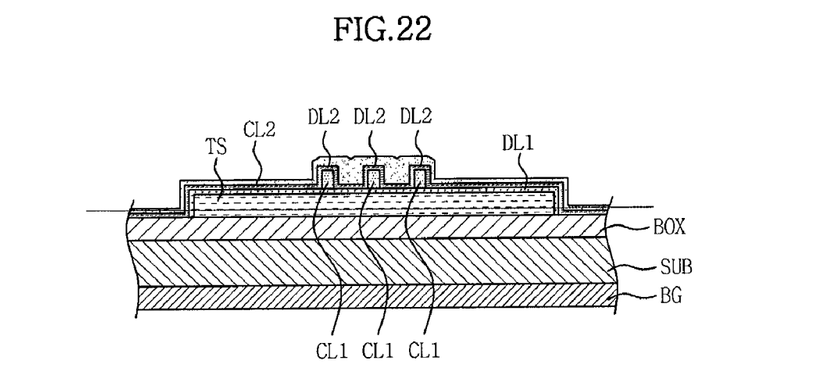
FIG. 22 is a sectional view of line C-C in FIG. 21.
Figure 23:
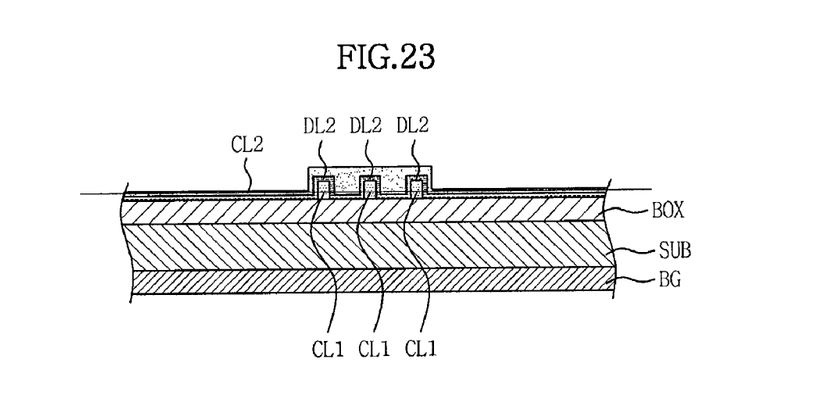
FIG. 23 is a sectional view of line D-D in FIG. 21.

FIG. 21 is a perspective view illustrating a state where the second conductive layer CL2 is formed through a deposition process. FIG. 22 is a sectional view of line C-C in FIG. 21 for illustrating that the second conductive layer CL2 is formed at a position where the channel CH is formed. FIG. 23 is a sectional view of line D-D in FIG. 21 for illustrating that the second conductive layer CL2 is formed at a position where the channel CH is not formed.

A polishing process (j) is then carried out. The polishing process is performed until the wafer has the same thickness. In a preferred embodiment of the present invention, the polishing process is performed to the portion indicated by a solid line in FIGS. 22 and 23. If the polishing process (j) is performed, similar results as those obtained by forming the second dielectric films DL2 using a thermal oxidization process are obtained.

Figure 24:
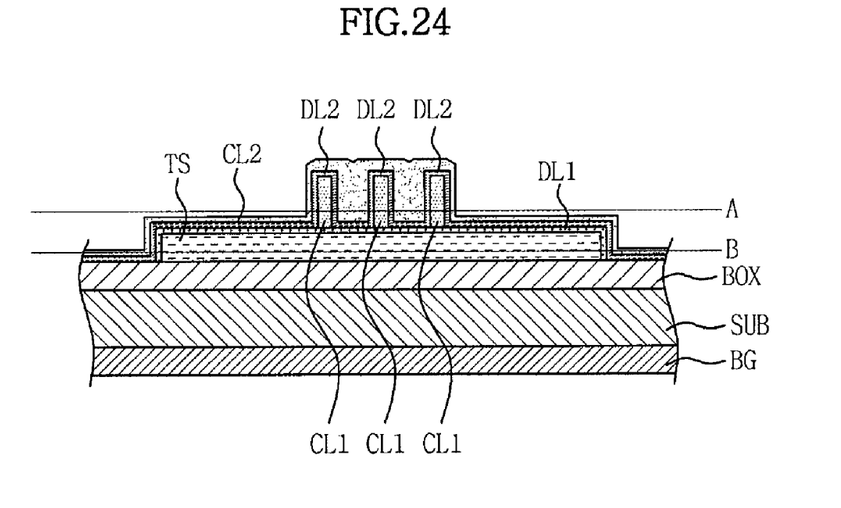
FIGS. 24 and 25 are sectional views illustrating an example where the first conductive layers CL1 are formed relatively thickly in another embodiment of the present invention.
Figure 25:
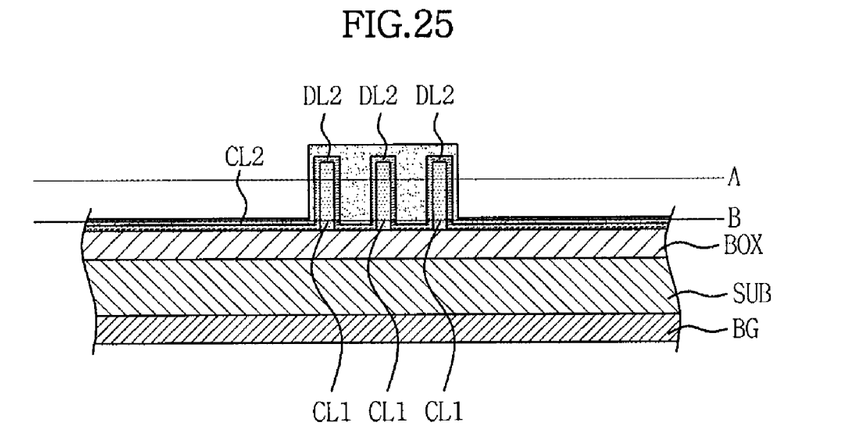

However, in a preferred embodiment of the present invention, if the first conductive layer CL1 is formed thickly compared with the above method as shown in FIGS. 24 and 25, the thickness of the second conductive layer CL2 filled between the nanoscale patterns PAT becomes relatively thick. FIGS. 24 and 25 are sectional views of line C-C and line D-D of FIG. 21, for illustrating an example where the first conductive layers CL1 are formed thickly.

In the case of the wafer formed as described above, the polishing process may be performed differently, as indicated by straight lines A and B in FIGS. 24 and 25.

If the polishing process is performed to the straight line A, the second conductive layer CL2 connected to all the top, left and right surfaces of the channel CH is divided into respective lines, and a similar shape to a so-called gate-all-around shape in which the entire lines of the first conductive layers CL1 and the second conductive layer CL2 are all connected to the left, right and top surfaces of the channel is obtained.

Further, if the polishing process is performed to the straight line B, the first conductive layers have a similar shape to the gate-all-around shape in which they are all connected to the left, right and top surfaces of the channel, and the second conductive layer CL2 remains only on the left and right sides of the channel, so that respective lines become two independent gates.

Accordingly, various shapes of gates can be obtained depending on the degree of the performed polishing in the polishing process. In particular, in an embodiment of the present invention, the first conductive layer CL1 has been described as an example. However, various shapes of gates can be obtained through the polishing process performed by arbitrarily controlling the thickness of the dielectric film and the conductive layer.

In other words, in the polishing process (j), two gates, which form the quantum dots of the top silicon and control the state of the quantum dots, respectively, may be formed to independently operate on both sides of the channel, or a gate may be formed to surround the left, right and top surfaces of the channel, by controlling a polished depth.

Processes subsequent to the polishing process are the same as those of the above embodiment, and description thereof will be omitted.

Although the specific embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention has the following advantages.

1) Since a gap between patterns is formed as another pattern, the same result as substantially improved lithography performance can be obtained.

2) As a polishing process is applied, not only patterns are cut off, but also a completed structure has a plane. Thus, a multi-structure can be obtained by depositing additional conductive layers after dielectric films are formed.

3) If a material capable of implementing a conductive channel, such as another polysilicon, is laminated and patterned by employing characteristics of a wafer to which the polishing process is applied, a sensor for sensing a charge distribution state of electrons within quantum dots of a lower layer that is already fabricated can also be fabricated.

4) Quantum dots having a size much smaller than that of quantum dots, which could be fabricated using the existing top-down method, can be formed and controlled through processes, such as nonoscale pattering and polishing employing electron beam lithography.

The invention claimed is:

1. A method of fabricating a nanoscale multi-junction quantum dot device, the method comprising the steps of:
   (a) patterning a source and a drain, connected through a channel, on top silicon of a wafer, and etching the wafer;
   (b) doping ions into the source, the drain and the channel;
   (c) forming a first dielectric film on the top silicon;
   (d) depositing a first conductive layer to surround the first dielectric film;
   (e) coating a resist on the first conductive layer;
   (f) forming at least three resist lines by developing the resist;
   (g) etching the first conductive layer to the first dielectric film except for the respective resist lines, thus forming nanoscale patterns respectively having the same line width as that of the resist line;
   (h) forming a second dielectric film for insulation on each nanoscale pattern;

(i) depositing a second conductive layer between the nanoscale patterns on which the second dielectric films are formed;
(j) polishing the wafer to expose the surface of top silicon;
(k) forming a dielectric film for electrical insulation on the top silicon;
(l) depositing a third conductive layer on the dielectric film; and
(m) patterning and etching at least two sensing elements, which corresponds to at least two quantum dots, which are formed in the channel in the polishing step (j), and are adjacent to each other.

2. The method of claim 1, wherein the patterning and etching step (a) the patterning is performed using a Silicon On Insulator (SOI) wafer as a wafer.

3. The method of claim 2, wherein in the patterning and etching step (a), the patterning step is performed using a CMOS process and electron beam lithography.

4. The method of claim 1, wherein the channel has a line width of several to several tens of nanometers.

5. The method of claim 1, wherein in the doping step (b), the source and the drain are doped with an N type impurity, and the channel is doped with a P type impurity.

6. The method of claim 1, wherein the first dielectric film formation step (c) is performed using a thermal oxidization process.

7. The method of claim 1, wherein the deposit step (d) includes depositing the first conductive layer thicker than the top silicon.

8. The method of claim 1, wherein the coating step (e) includes coating an electro resist.

9. The method of claim 1, wherein the resist line formation step (f) is performed using electron beam lithography so that the resist lines become vertical to the channel.

10. The method of claim 1, wherein the nonoscale pattern formation step (g) is performed by employing anisotropic etching.

11. The method of claim 1, wherein in the polishing step (j), forms two pairs of tunneling barrier gates, said two pairs of tunneling barrier gates facing each other around the channel, forms a pair of coupling gates between the two pairs of tunneling barrier gates and forms a pair of control gates between the tunneling barrier gates and the coupling gates, respectively.

12. The method of claim 11, wherein quantum dots are formed at positions where said pair of control gates faces each other in the channel.

13. The method of claim 11, wherein in the polishing step (j), a gate for forming quantum dots of the top silicon and a gate for controlling a state of the quantum dots are formed on both sides of the channel in such a way as to operate independently of each other, or a gate is selectively formed in such a way as to surround left, right and top surfaces of the channel, by controlling a polished depth.

14. The method of claim 1, wherein the pattern etch step (m) includes performing patterning using lithography and then etching.

15. The method of claim 14, wherein the pattern etch step (m) includes performing patterning and etching a single electron transistor, a radio-frequency single electron transistor (RF-SET), and a Quantum Point Contact (QPC) as sensing elements.

16. A nanoscale multi junction quantum dot device fabricated using a fabrication method according to any one of claims 1 to 15.

* * * * *

UNITED STATES PATENT AND TRADEMARK OFFICE
CERTIFICATE OF CORRECTION

PATENT NO. : 8,178,369 B2
APPLICATION NO. : 12/444956
DATED : May 15, 2012
INVENTOR(S) : Jung Bum Choi et al.

It is certified that error appears in the above-identified patent and that said Letters Patent is hereby corrected as shown below:

Col. 10, lines 1-3, the word "nanoscale" is misspelled in Claim 10. Claim 10 is corrected to read:
"The method of claim 1, wherein the nanoscale pattern formation step (g) is performed by employing anisotropic etching."

Signed and Sealed this
Thirty-first Day of July, 2012

David J. Kappos
*Director of the United States Patent and Trademark Office*